United States Patent
Ichihara et al.

(10) Patent No.: US 8,320,157 B2
(45) Date of Patent: Nov. 27, 2012

(54) NONVOLATILE SEMICONDUCTOR MEMORY DEVICE

(75) Inventors: Reika Ichihara, Yokohama (JP); Takayuki Tsukamoto, Yokkaichi (JP); Hiroshi Kanno, Yokkaichi (JP); Kenichi Murooka, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 288 days.

(21) Appl. No.: 12/876,637

(22) Filed: Sep. 7, 2010

(65) Prior Publication Data
US 2011/0069532 A1 Mar. 24, 2011

(30) Foreign Application Priority Data

Sep. 18, 2009 (JP) .................................. 2009-217576

(51) Int. Cl.
*G11C 11/00* (2006.01)
(52) U.S. Cl. ... 365/148; 365/158; 365/171; 365/185.18; 365/185.29
(58) Field of Classification Search .................. 365/148, 365/158, 163, 171, 185.18, 185.29
See application file for complete search history.

(56) References Cited

U.S. PATENT DOCUMENTS

| | | | |
|---|---|---|---|
| 7,443,712 B2 | 10/2008 | Bill et al. | |
| 2007/0008768 A1* | 1/2007 | Daley | ............................ 365/148 |
| 2007/0133358 A1* | 6/2007 | Kubo et al. | ................. 369/13.38 |
| 2007/0285964 A1* | 12/2007 | Toda et al. | ..................... 365/148 |
| 2010/0237314 A1 | 9/2010 | Tsukamoto et al. | |
| 2011/0235400 A1 | 9/2011 | Shimotori et al. | |

FOREIGN PATENT DOCUMENTS

| | | |
|---|---|---|
| JP | 2005-522045 | 7/2005 |
| JP | 2006-344349 | 12/2006 |
| JP | 2008-541452 | 11/2008 |
| JP | 2009-517864 | 4/2009 |

OTHER PUBLICATIONS

U.S. Appl. No. 13/234,796, filed Sep. 16, 2011, Takashima, et al.
U.S. Appl. No. 13/239,899, filed Sep. 22, 2011, Ichihara, et al.
Office Action issued Dec. 20, 2011 in Japan Application No. 2009-217576 (With English Translation).

* cited by examiner

*Primary Examiner* — Pho M Luu
*Assistant Examiner* — Thao Bui
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array and a control circuit. The memory cell array includes a plurality of first wirings, a plurality of second wirings intersecting the plurality of first wirings, and a plurality of memory cells provided at the intersections of the plurality of first and second wirings and each including a non-ohmic element and a variable resistance element connected in series. The control circuit selects one of the plurality of memory cells, generates an erasing pulse for erasing data from the selected memory cell, and supplies the erasing pulse to the selected memory cell. The control circuit executes data erase by applying a voltage of the erasing pulse to the non-ohmic element in the reverse bias direction.

20 Claims, 13 Drawing Sheets

(a) SCHOTTKY STRUCTURE (b) PN STRUCTURE (c) PIN STRUCTURE (1) SELECTED CELL (2) UNSELECTED CELL (1) SELECTED CELL (2) HALF-SELECTED CELL 1, HALF-SELECTED CELL 2

V4 = 1/2 × V3

(1) SELECTED CELL (2) UNSELECTED CELL (1) SELECTED CELL (2) HALF-SELECTED CELL 1, HALF-SELECTED CELL 2

V4 = 1/2 × V3

US 8,320,157 B2

NONVOLATILE SEMICONDUCTOR MEMORY DEVICE

CROSS REFERENCE TO RELATED APPLICATIONS

This application is based upon and claims the benefit of priority from prior Japanese Patent Application No. 2009-217576, filed on Sep. 18, 2009, the entire contents of which are incorporated herein by reference.

BACKGROUND

1. Field

Embodiments described herein relate generally to a nonvolatile semiconductor memory device using a variable resistance element configured to store a resistance value as data.

2. Description of the Related Art

As an electrically-rewritable nonvolatile memory, a flash memories have conventionally been known in which a memory cell array is configured by NAND connection or NOR connection of memory cells each having a floating gate structure. A ferroelectric memories are also known as a memory which is nonvolatile and compatible with fast random access.

Meanwhile, as a technique for enabling greater miniaturization of memory cells, a resistance varying memory using a variable resistance element in each memory cell is proposed. Known variable resistance elements include: a phase change memory element varying a resistance by phase changes of a chalcogenide compound between a crystallized state and an amorphous state; an MRAM element using resistance changes due to tunnel magnetoresistance effect; a memory element of a polymer ferroelectric RAM (PFRAM) including a resistance element made of a conductive polymer; a ReRAM element inducing resistance changes upon electric pulse application, etc. (JP2006-344349A).

In the resistance varying memory, memory cells can be configured by a series circuit of not a transistor but a diode and a variable resistance element. Therefore, memory cells can be easily stacked to a three-dimensional structure and hence are advantageous for higher integration (JP2005-522045A).

When writing data into a ReRAM memory cell, a certain voltage is applied to the variable resistance element for a short time. In response to this, the variable resistance element changes from a high resistance state to a low resistance state. On the other hand, when erasing data from a ReRAM memory cell, a certain voltage lower than the voltage applied in the writing operation is applied for a long time to the variable resistance element which is in a low resistance state, in order to cause Joule heat by a current flowing through the variable resistance element. In response to this, the variable resistance element changes from a low resistance state to a high resistance state. The memory cells are defined as being stable when, for example, they are in a high resistance state. When the memory cells are configured to store binary data, data is written into the memory cells by a writing operation of changing the memory cells from the stable high resistance state to a low resistance state.

When erasing data from such a resistance varying memory, a certain erasing voltage is applied to a memory cell configured as a series circuit of a diode and a variable resistance element. Therefore, a voltage to be applied to the variable resistance element is determined by the resistance ratio between the diode and the variable resistance element. Hence, the instant the variable resistance element under the data erase operation changes from a low resistance state to a high resistance state, the voltage applied to the variable resistance element might rise and exceed the writing voltage to induce a so-called erroneous writing which causes the memory cell to be written again.

DETAILED DESCRIPTION

A nonvolatile semiconductor memory device according to one embodiment includes a memory cell array and a control circuit. The memory cell array includes a plurality of first wirings, a plurality of second wirings intersecting the plurality of first wirings, and a plurality of memory cells provided at the intersections of the plurality of first and second wirings and each including a non-ohmic element and a variable resistance element which are connected in series. The control circuit is configured to select one of the plurality of memory cells, generate an erasing pulse for erasing data from the selected memory cell, and supply the erasing pulse to the selected memory cell. The control circuit executes data erase by applying a voltage of the erasing pulse to the non-ohmic element in the reverse bias direction.

Embodiments of a nonvolatile semiconductor memory device according to the present invention will now be explained in detail with reference to the drawings.

FIRST EMBODIMENT

[Configuration of Nonvolatile Semiconductor Memory Device According to First Embodiment]

Figure 1:
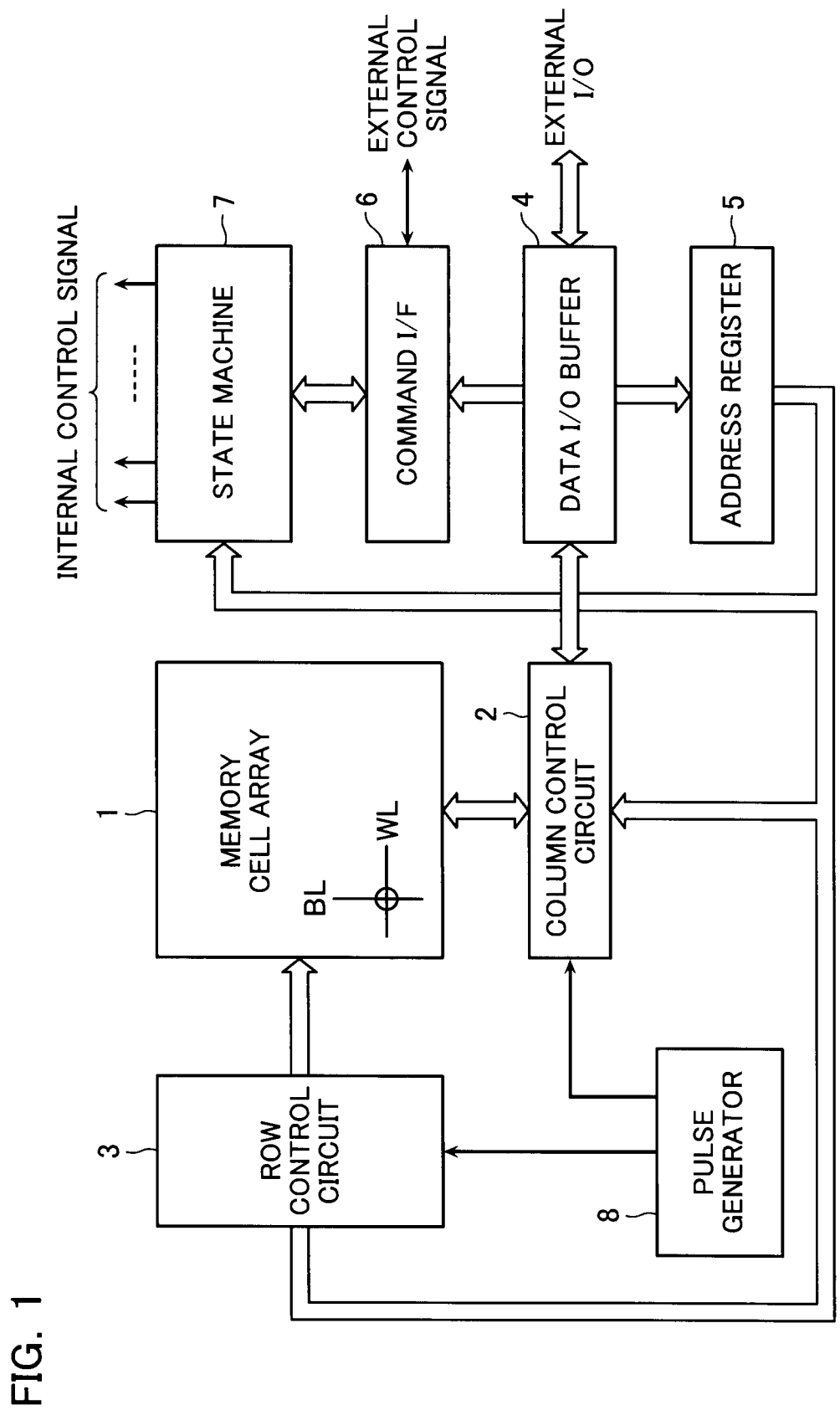
FIG. 1 is a block diagram of a nonvolatile semiconductor memory device according to a first embodiment.

FIG. 1 is a block diagram of a nonvolatile semiconductor memory device according to a first embodiment of the present invention.

The present nonvolatile semiconductor memory device includes a memory cell array 1 in which memory cells each using a later-described ReRAM element (variable resistance element) are arranged in a matrix formation. A column control circuit 2 is provided at a position adjoining the memory cell array 1 in the direction along bit lines BL. The column control circuit 2 is part of a control circuit configured to control bit lines BL of the memory cell array 1 to execute erase of data from a memory cell, write of data into a memory cell, and read of data from a memory cell. A row control circuit 3 is provided at a position adjoining the memory cell array 1 in the direction along word lines WL. The row control circuit 3 is part of the control circuit configured to select a word line WL of the memory cell array 1 to apply a voltage necessary for erase of data from a memory cell, write of data into a memory cell, and read of data from a memory cell.

A data I/O buffer 4 is connected to an unillustrated external host through an I/O line to receive write data and an erase instruction, output read-out data, and receive address data and command data. The data I/O buffer 4 sends received write data to the column control circuit 2, and receives read-out data from the column control circuit 2 and externally outputs the data. An address externally supplied to the data I/O buffer 4 is sent to the column control circuit 2 and the row control circuit 3 via an address register 5. A command supplied from the host to the data I/O buffer 4 is sent to a command interface 6. The command interface 6 receives an external control signal from the host, determines whether data input in the data I/O buffer 4 is write data, a command, or an address, and when it is a command, transfers it as a received command signal to a state machine 7 which is part of the control circuit. The state machine 7 manages the entire semiconductor memory device, and receives a command from the host to execute read, write, erase, I/O management of data, etc. The external host is capable of receiving status information managed by the state machine 7 and determining an operation result. The status information is used for controlling write and erase.

A pulse generator 8 which is part of the control circuit is controlled by the state machine 7. Under this control, the pulse generator 8 becomes able to output a pulse of an arbitrary voltage at an arbitrary timing. Specifically, the state machine 7 receives an externally supplied address through the address register 5, and determines which memory cell is accessed by the address. The pulse generator 8 generates a pulse for this memory cell. The generated pulse can be transferred to an arbitrary line selected by the column control circuit 2 and the row control circuit 3.

Peripheral circuit elements other than the memory cell array 1 can be formed in a silicon substrate immediately under the memory cell array 1. Therefore, the chip area of the semiconductor memory device can be substantially equal to the area of the memory cell array 1.

Figure 2:
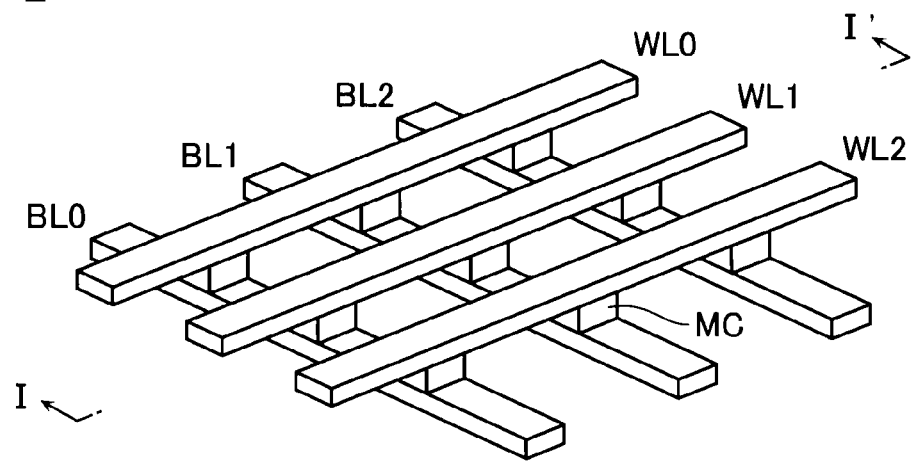
FIG. 2 is a perspective diagram of a part of a memory cell array of the nonvolatile semiconductor memory device according to the first embodiment.
Figure 3:
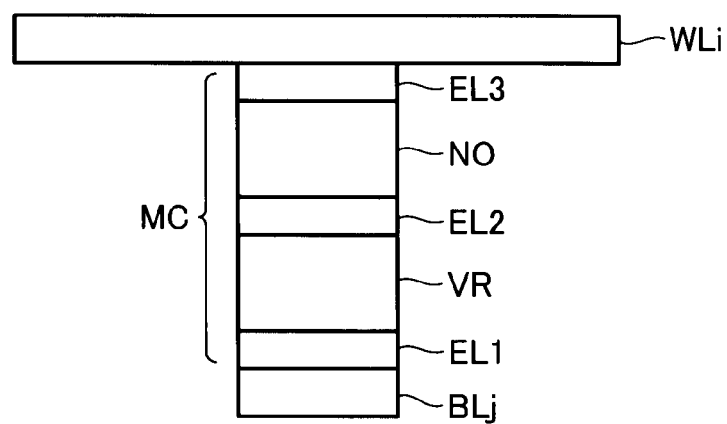
FIG. 3 is a cross sectional diagram of one memory cell taken along a line I-I' of FIG. 2 and seen as indicated by the arrows.

FIG. 2 is a perspective diagram of a part of the memory cell array 1. FIG. 3 is a cross sectional diagram of one memory cell taken along a line I-I' of FIG. 2 and seen as indicated by the arrows.

Bit lines BL0 to BL2 as a plurality of first wirings are provided in parallel, and word lines WL0 to WL2 as a plurality of second wirings are provided in parallel to intersect the bit lines. Memory cells MC are provided at the intersections of the bit lines BL0 to BL2 and the word lines WL0 to WL2 as sandwiched between these lines. The bit lines BL and the word lines WL are preferably made of a material that is heat-resistant and has a low resistance, and may be made of, for example, W, WSi, NiSi, CoSi, etc.

As shown in FIG. 3, the memory cell MC is configured by a series circuit of a variable resistance element VR and a non-ohmic element NO.

Electrodes EL2 and EL1 are provided at the top and bottom of the variable resistance element VR to function as a barrier metal and an adhesive layer. The electrode material may be Pt, Au, Ag, TiAlN, SrRuO, Ru, RuN, Ir, Co, Ti, TiN, TaN, LaNiO, Al, PtIrO$_x$, PtRhO$_x$, Rh, TaAlN, etc. The variable resistance element VR may include a metal layer that provides a uniform orientation. The variable resistance element VR may also specially include a buffer layer, a barrier metal layer, an adhesive layer, etc.

An element that can vary its resistance by a current, heat, chemical energy, etc. upon voltage application is used as the variable resistance element VR. For example, an element (ReRAM) that is made of a complex compound containing a cation to become a transition element and that varies its resistance by cation migration can be used as the variable resistance element VR.

Figure 4:
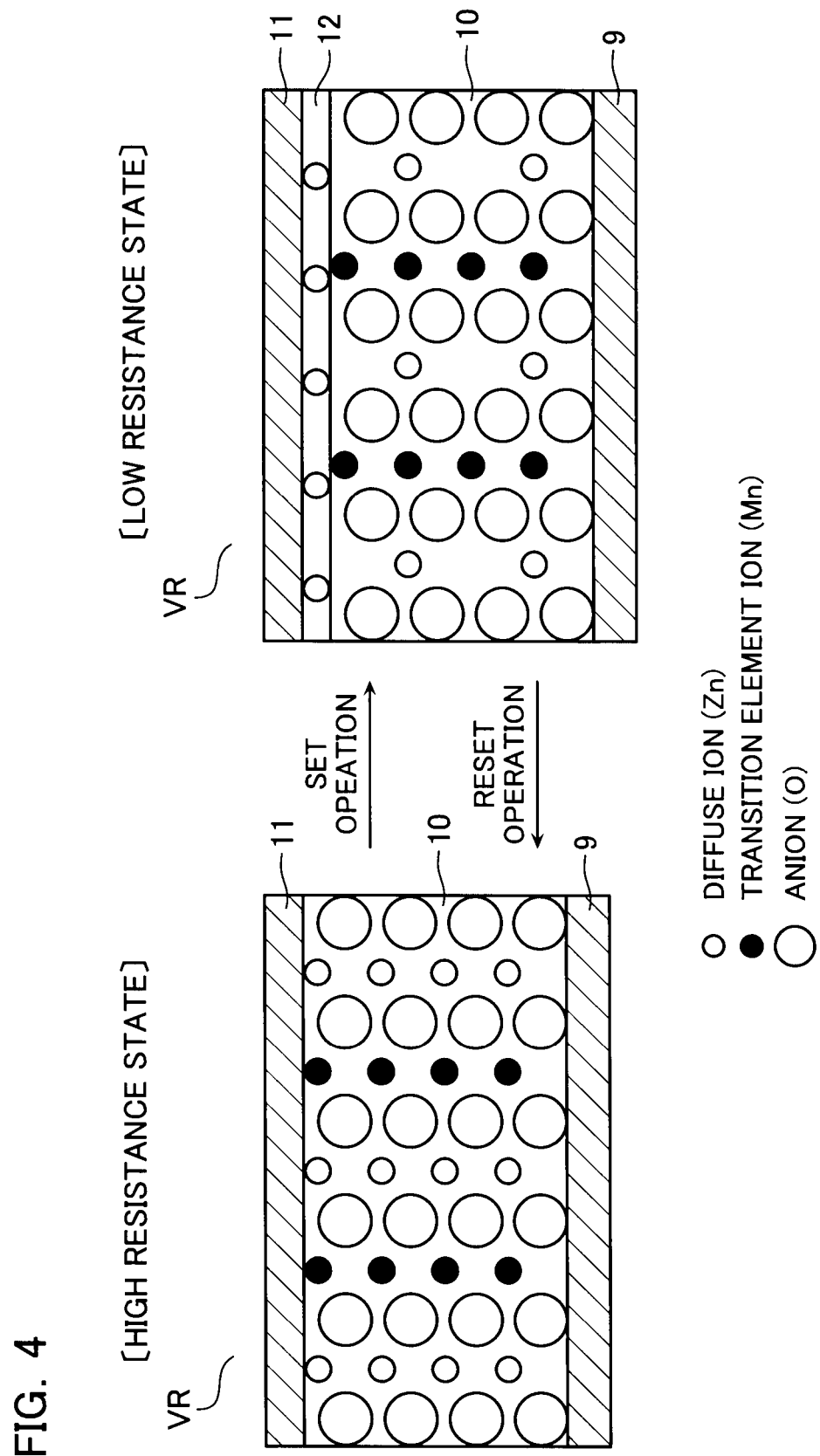
FIG. 4 is an exemplary cross sectional diagram showing an example of variable resistance element according to the first embodiment.

FIG. 4 is a diagram showing an example of the variable resistance element VR. The variable resistance element VR shown in FIG. 4 includes electrode layers 9 and 11 and a recording layer 10 provided between them. The recording layer 10 is made of a complex compound containing at least two kinds of cationic elements. At least one kind of the cationic elements should be a transition element having a d-orbital incompletely filled with electrons, and the shortest distance between adjoining cationic elements should be 0.32 nm or shorter.

The example of FIG. 4 is an example in which ZnMnO is used as the recording layer 10. Small white circles in the recording layer 10 represent diffuse ions (Zn), large white circles represent anions (O), and small black circles represent transition element ions (Mn). An initial state of the recording layer 10 is a high resistance state. When a negative voltage is applied to the electrode layer 11 while the electrode layer 9 is set at a fixed potential, some diffuse ions in the recording layer 10 migrate toward the electrode layer 11, and hence diffuse ions in the recording layer 10 are reduced relative to anions. The diffuse ions having migrated toward the electrode layer 11 receive electrons from the electrode layer 11 and precipitate as a metal, thus forming a metal layer 12. In the recording layer 10, anions have become excessive, and this leads to an increase of the valence of the transition element ions in the recording layer 10. Hence, the recording layer 10 becomes electron-conductive due to carrier injection, and a program operation (a write operation) of the recording layer 10 is thus completed. To reproduce the data, such a minute current as would not induce a resistance change of the material of the recording layer 10 is caused to flow through the recording layer 10. To reset the programmed state (low resistance state) to the initial state (high resistance state), for example, a large current is caused to flow through the recording layer 10 for a sufficient time to cause Joule heating and promote the oxidoreduction reaction of the recording layer 10. It is also possible to execute a reset operation by applying an electric field in a direction opposite to the program operation. In the following explanation, a reset operation of changing the variable resistance element from a low resistance state to a high resistance state will be referred to as "data erase".

Transition metal compounds such as $HfO_x$, $HfSiO_x$, $MnO_x$, $MnAl_xO_y$, $ZnMnO_x$, $NiO_x$, $TiO_x$, $WO_x$, etc. can also be used as the variable resistance element VR.

Figure 5:
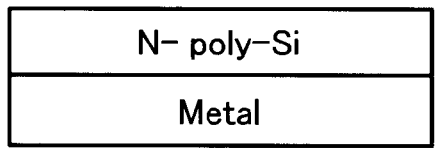
FIG. 5 is an exemplary cross sectional diagram showing examples of non-ohmic element according to the first embodiment.
Figure 5:
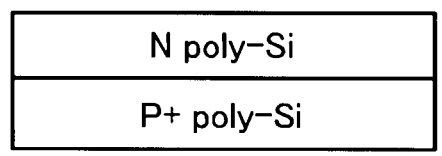
Figure 5:
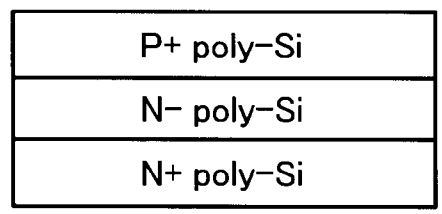

As shown in FIG. 5, the non-ohmic element NO is configured by any type of diode such as, for example, (a) a Schottky diode, (b) a PN junction diode, (c) a PIN diode, etc. The non-ohmic element NO may also include electrodes EL1 and EL2 which form a barrier metal layer and an adhesive layer. When a diode is used, a unipolar operation becomes available based on the characteristic of the diode. The arrangement of the non-ohmic element NO and the variable resistance element VR may be reversed from the arrangement of FIG. 4 vertically, or the polarities of the non-ohmic element NO may be reversed vertically.

Next, a problem of erroneous writing after data erase of such a memory cell MC will be explained.

In the nonvolatile semiconductor memory device using the variable resistance element VR, it is feared that an erroneous operation might be induced when the variable resistance element VR shifts from a low resistance state to a high resistance state in response to data erase of the memory cell MC. The erroneous operation is induced because in the nonvolatile semiconductor memory device, the diode as the non-ohmic element NO functions as a resistive component connected in series to the variable resistance element VR. Specifically, when an erasing pulse is applied in a data erase operation in the forward bias direction with respect to the diode, the voltage of the erasing pulse is divided according to the resistance value of the diode and the resistance value of the variable resistance element VR in a low resistance state. Here, the instant the variable resistance element VR shifts from the low resistance state to a high resistance state, the voltage applied to the memory cell MC concentrates on the variable resistance element VR. As a result, the voltage applied to the variable resistance element VR sharply rises. When there is not a sufficiently large difference between the voltage necessary for data erase of the memory cell MC and the voltage necessary for data write, the voltage applied to the variable resistance element VR exceeds the voltage necessary for data write the instant the variable resistance element VR shifts to the high resistance state, thus causing erroneous writing.

The configuration and operation of the nonvolatile semiconductor memory device according to the present embodiment for solving these problems will now be explained.

Figure 6:
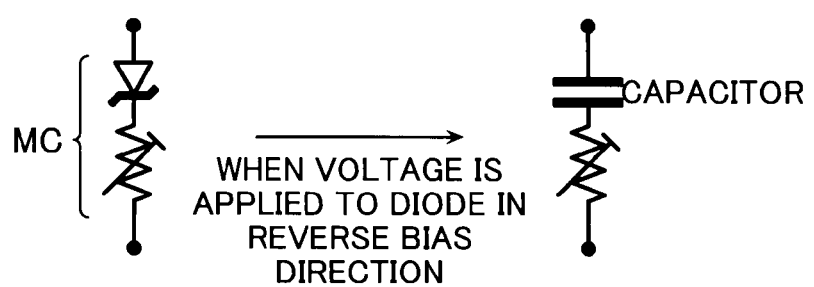
FIG. 6 is an equivalent circuit diagram of a memory cell of the nonvolatile semiconductor memory device according to the first embodiment.

FIG. 6 is an equivalent circuit diagram of a memory cell of the nonvolatile semiconductor memory device according to the first embodiment. FIG. 6 shows an equivalent circuit diagram of the memory cell MC described above and an equivalent circuit diagram of the memory cell MC when a reverse bias voltage is applied to the memory cell MC.

In order to prevent occurrence of erroneous writing after data erase of the memory cell MC, the nonvolatile semiconductor memory device according to the present embodiment executes data erase based on a current that occurs in response to charging or discharging of a capacitor which is connected in series to the variable resistance element VR. As described above, the nonvolatile semiconductor memory device according to the present embodiment uses a memory cell MC in which a series circuit of a diode as the non-ohmic element NO and the variable resistance element VR are connected in series. When erasing data from the memory cell MC, a voltage is applied in the reverse bias direction of the diode. Hence, the diode comes to function as a capacitor. By using this diode functioning as a capacitor, the data erase is executed based on a current that occurs in response to charging or discharging of this capacitor. The data erase operation of the nonvolatile semiconductor memory device will now be explained.

[Operation of Nonvolatile Semiconductor Memory Device According to First Embodiment]

Figure 7:
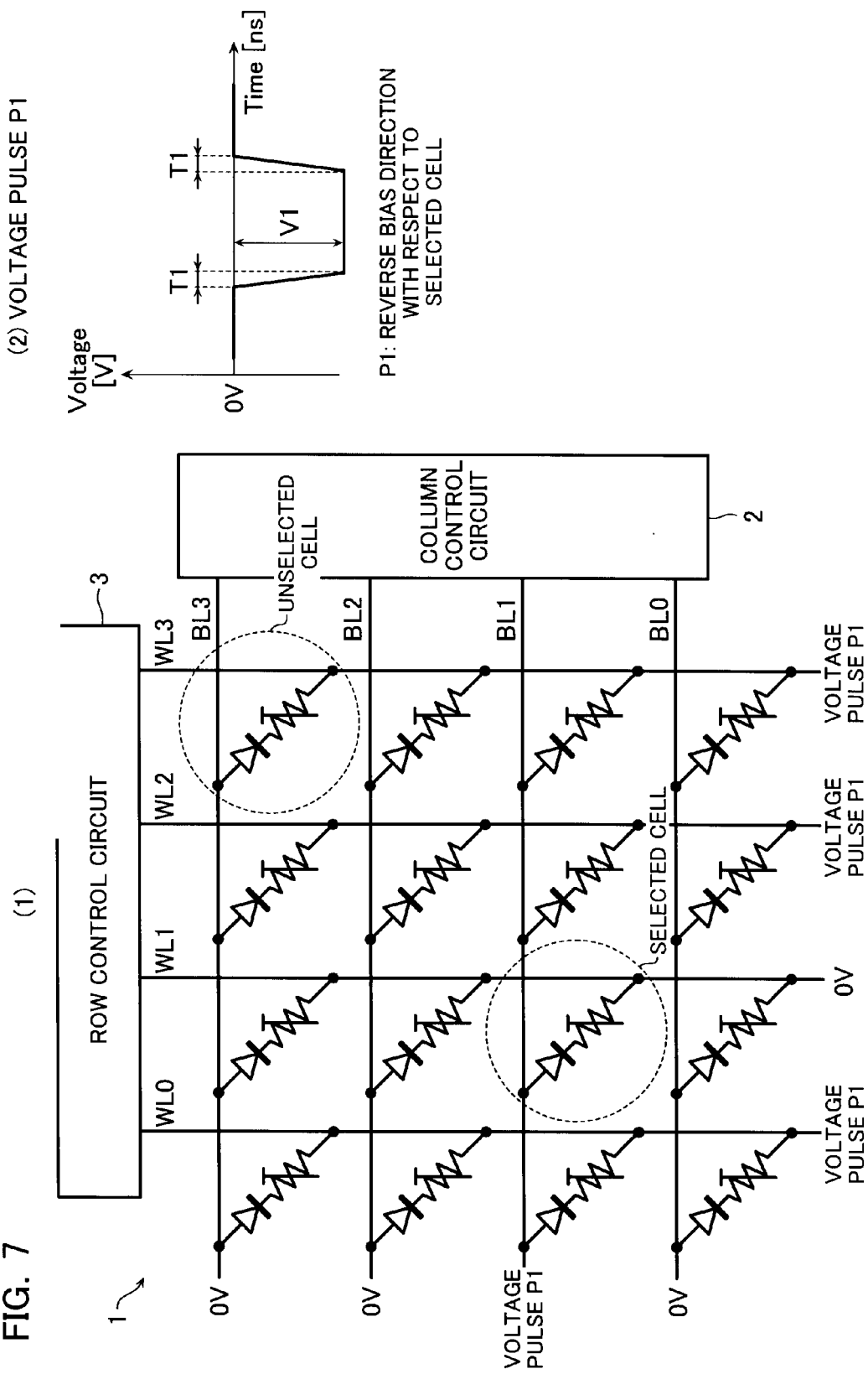
FIG. 7 is a diagram showing a memory cell array of the first embodiment and a waveform of an erasing pulse generated by a control circuit in a data erase operation.
Figure 8:
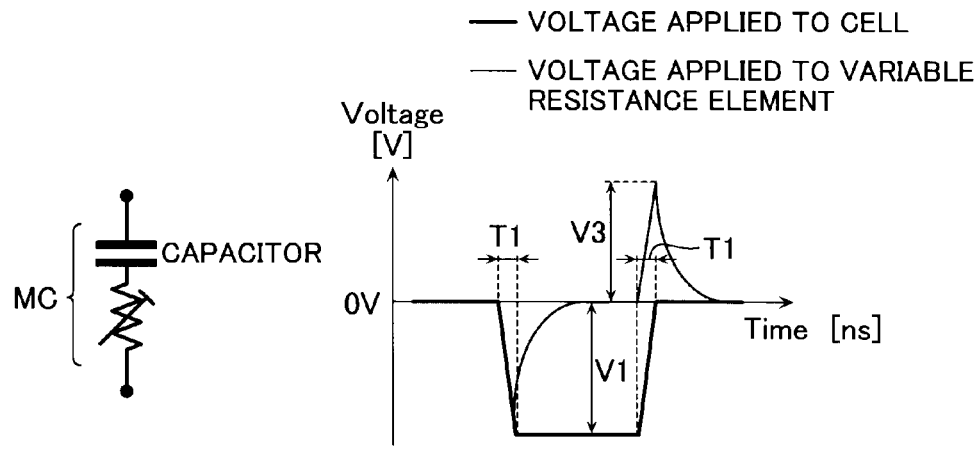
FIG. 8 is a diagram showing memory cells of the first embodiment and waveforms of voltages applied to the memory cells.
Figure 8:
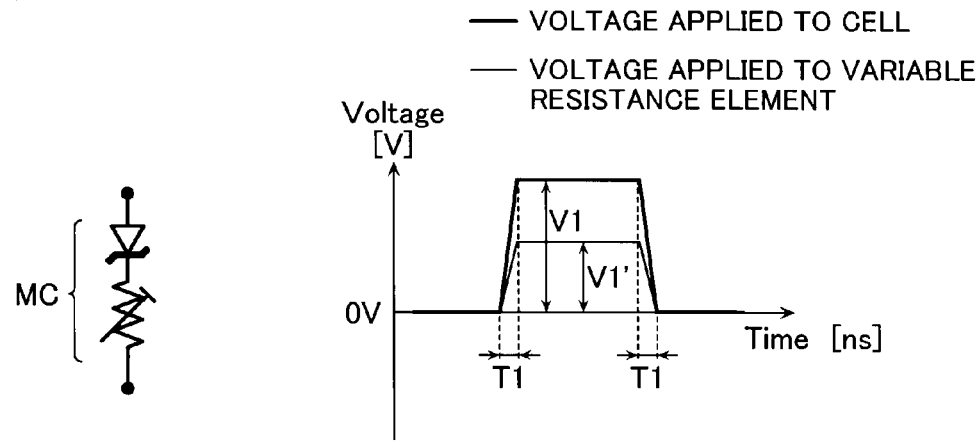

With reference to FIG. 7 and FIG. 8, a data erase operation of the nonvolatile semiconductor memory device according to the present embodiment will be explained. FIG. 7 is a diagram showing the memory cell array of the present embodiment and a waveform of an erasing pulse generated by the control circuit in the data erase operation.

In the memory cell array 1 of the present embodiment shown in FIG. 7(1), it is assumed that a selected bit line and a selected word line are the bit line BL1 and the word line WL1 respectively. The memory cell MC connected to the bit line BL1 and the word line WL1 are the selected cell. The column control circuit 2 and the row control circuit 3 execute data erase on this selected cell. In the other embodiments to be described later, it is also assumed that the selected bit line and the selected word line are the bit line BL1 and the word line WL1.

In the data erase operation of the selected cell, the column control circuit 2 applies a voltage pulse P1 to the selected bit line BL1. The waveform of the voltage pulse P1 is shown in FIG. 7(2). As shown in FIG. 7(2), the voltage pulse P1 is a pulse having a negative voltage value, and the absolute value (amplitude) of the voltage value is represented by a voltage V1. Here, a time necessary for a voltage change of the voltage pulse P1 to occur immediately after pulse application is started (such a voltage change will hereinafter be referred to as front edge) and a time necessary for a voltage change of the voltage pulse P1 to occur immediately before pulse application is finished (such a voltage change will hereinafter be referred to as rear edge) are a time T1. The column control circuit2 sets the unselected bit lines BL0, BL2, and BL3 to 0V.

In the data erase operation of the selected cell, the row control circuit 3 sets the selected word line WL1 to 0V. Then, the row control circuit 3 applies a voltage pulse P1 to the unselected word lines WL0, WL2, and WL3. The voltage waveform of the voltage pulse P1 applied to the unselected word lines WL0, WL2, and WL3 is the same as the voltage pulse P1 applied to the selected bit line BL1, and shown in FIG. 7(2).

FIG. 8 is a diagram showing the memory cells of the present embodiment and voltage waveforms applied to the memory cells. FIG. 8 shows an equivalent circuit diagram of the selected cell and a voltage waveform, and an equivalent circuit diagram of unselected cells and a voltage waveform. Here, unselected cells are memory cells MC connected between the unselected bit line BL0, BL2, or BL3 and the unselected word line WL0, WL2, or WL3 shown in FIG. 7(1).

As described above, the voltage pulse P1 applied to the selected bit line BL1 is a pulse having a negative voltage value. Hence, the voltage pulse P1 applied across from the selected bit line BL1 to the selected word line WL1 is an erasing pulse in the reverse bias direction (here, a negative direction) with respect to the diode of the selected cell. As shown in FIG. 8(1), the diode of the selected cell that is applied with the pulse in the reverse bias direction comes to function as a capacitor. When the voltage pulse P1 is applied to the memory cell MC, junction capacitance of the diode functioning as a capacitor is charged and discharged at the timings of the front edge and the rear edge of the voltage pulse P1. Hence, a current flows through the variable capacitance element VR and a voltage is applied to the variable resistance element VR. FIG. 8(1) shows a waveform of the voltage applied to the variable resistance element VR when the voltage pulse P1 is applied to the selected cell. A charging current in a negative direction and a discharging current in a positive direction flow through the variable resistance element VR at the timings of the front and rear edges of the voltage pulse P1 respectively. The variable resistance element VR of the selected cell changes from a low resistance state to a high resistance state due to these charging and discharging currents, and hence data is erased from the selected cell.

A front edge period of the voltage pulse is a time period from a timing when the voltage value (absolute value) of the voltage pulse becomes the sum of the minimum value (absolute value; the same applies hereinafter) of the voltage and 10% of the voltage difference between the minimum value and a maximum value (absolute value; the same applies hereinafter) of the voltage until a timing when the voltage value of the voltage pulse becomes a difference obtained by subtracting 10% of the voltage difference between the minimum value and the maximum value of the voltage from the maximum value of the voltage. A rear edge period of the voltage pulse is a time period from a timing when the voltage value of the voltage pulse becomes a difference obtained by subtracting 10% of the voltage difference between the minimum value and the maximum value of the voltage from the maximum value of the voltage until a timing when the voltage value of the voltage pulse becomes the sum of the minimum value of the voltage and 10% of the voltage difference between the minimum value and the maximum value of the voltage. It is preferred that the time T1 necessary for the front edge and the rear edge be smaller than a product between the resistance value of the variable resistance element VR in a low resistance state and the value of the junction capacitance of the diode to which a voltage is applied in the reverse bias direction. For example, when it is assumed that the resistance value of the variable resistance element VR in a low resistance state is 200 [MΩ] and the value of the junction capacitance of the diode to which a voltage is applied in the reverse bias direction is 5e-12 [μF], it is preferred that the time T1 be shorter than 1 [ns].

On the other hand, in the unselected cells, the voltage pulse P1 applied to the unselected word lines WL0, WL2, and WL3 is a pulse in the forward bias direction (here, a positive direction) with respect to the diode of the unselected cells. As shown in FIG. 8(2), the diode of the unselected cells to which a pulse is applied in the forward bias direction does not function as a capacitor. When the voltage pulse P1 in the forward bias direction is applied to these memory cells MC, voltages divided according to the resistance value of the diode and the resistance value of the variable resistance element VR in a low resistance state are applied to the diode and the variable resistance element VR respectively. FIG. 8(2) shows a waveform of the voltage that is applied to the variable resistance element VR when the voltage pulse P1 in the forward bias direction is applied to the unselected cells. When it is assumed that the resistance value of the diode is $R_{diode}$ and the resistance value of the variable resistance element VR in a low resistance state is $R_{on}$, the voltage V1' applied to the variable resistance element VR can be represented as $V1'=V1 \times R_{on}/(R_{diode}+R_{on})$. The voltage V1' is sufficiently lower than the voltage V1, so the variable resistance element VR of the unselected cells does not change from a low resistance state to a high resistance state.

[Effect of Nonvolatile Semiconductor Memory Device According to First Embodiment]

As described above, when an erasing pulse is applied in the forward bias direction with respect to the diode, the voltage applied to the memory cell MC concentrates on the variable resistance element VR the instant the variable resistance element VR shifts from a low resistance state to a high resistance state. Therefore, the voltage applied to the variable resistance element VR might exceed the voltage necessary for data write, to cause erroneous writing.

As compared with this, the nonvolatile semiconductor memory device according to the present embodiment applies an erasing pulse in the reverse bias direction with respect to the diode of the selected cell. As a result, the diode of the selected cell comes to function as a capacitor. When the capacitor is charged or discharged upon erasing pulse application, a current flows through the variable resistance element VR and hence a voltage is applied to the variable resistance element VR. This voltage is applied to the variable resistance element VR regardless of the resistance of the non-ohmic element NO (diode) connected in series to the variable resistance element VR. Therefore, the voltage applied to the variable resistance element VR does not rise the instant the variable resistance element VR of the selected cell shifts from a low resistance state to the high resistance state, hence preventing an erroneous writing. Therefore, the nonvolatile semiconductor memory device according to the present embodiment can suppress the risk of erroneous writing in the data erase operation.

Even when an erasing pulse is applied in the manner described above, the variable resistance element VR of the unselected cells does not change from a low resistance state to a high resistance state as described above. In the memory cells MC connected between the unselected bit lines BL0, BL2, and BL3 and the selected word line WL1 and the memory cells MC connected between the selected bit line BL1 and the unselected word lines WL0, WL2, and WL3, there is no potential difference between the bit line BL and the word line WL. Therefore, no current flows through these memory cells MC and no fault occurs in the data erase operation.

SECOND EMBODIMENT

[Configuration of Nonvolatile Semiconductor Memory Device According to Second Embodiment]

Next, a nonvolatile semiconductor memory device according to a second embodiment of the present invention will be explained. Since the configuration of the nonvolatile semiconductor memory device according to the second embodiment is similar to the first embodiment, redundant explanation will not be given. The nonvolatile semiconductor memory device according to the second embodiment is different from the first embodiment in applying voltage pulses to both unselected bit lines BL and unselected word lines WL in a data erase operation.

[Operation of Nonvolatile Semiconductor Memory Device According to Second Embodiment]

Figure 9:
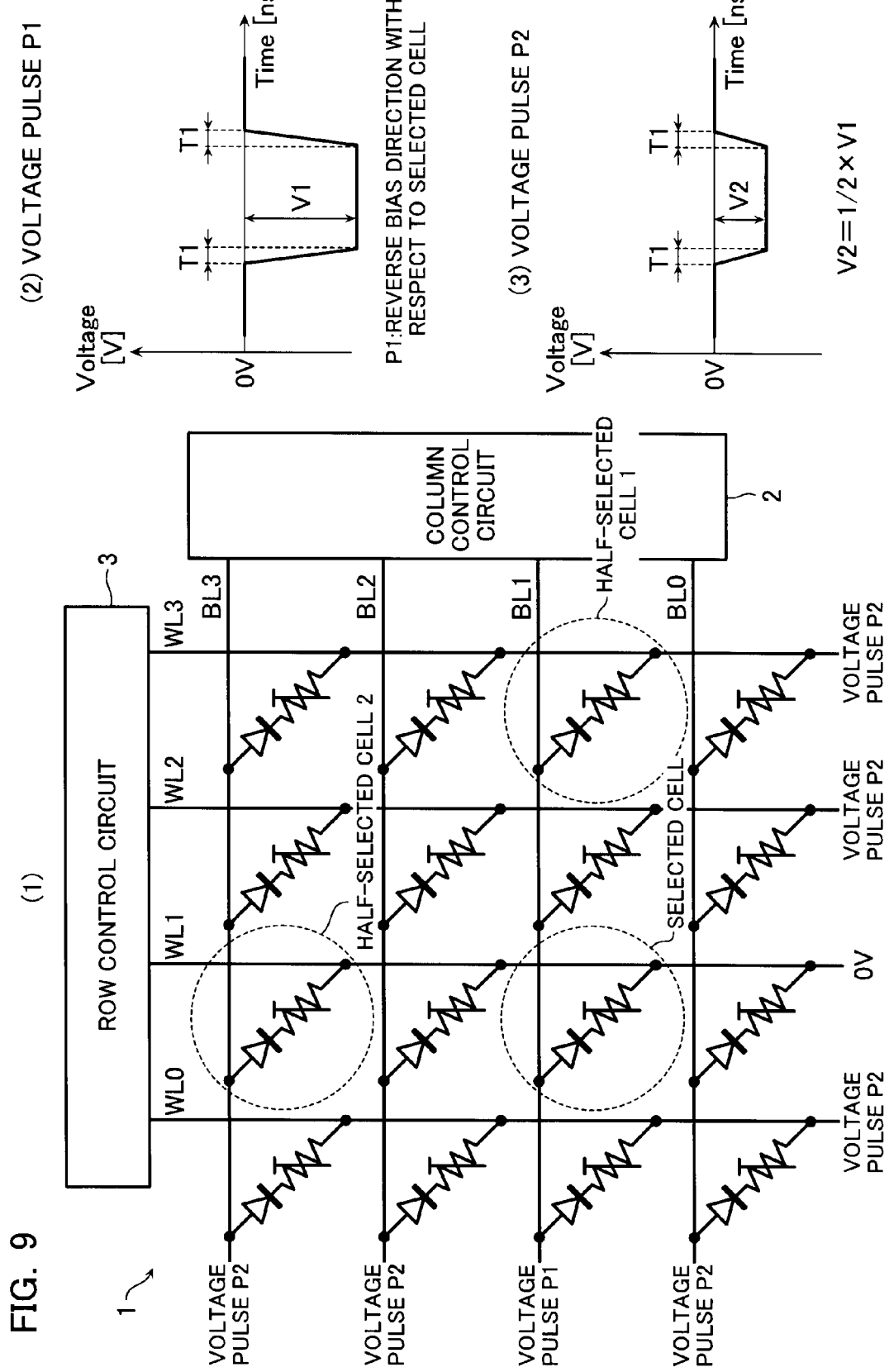
FIG. 9 is a diagram showing a memory cell array of a second embodiment and waveforms of erasing pulses generated by a control circuit in a data erase operation.
Figure 10:
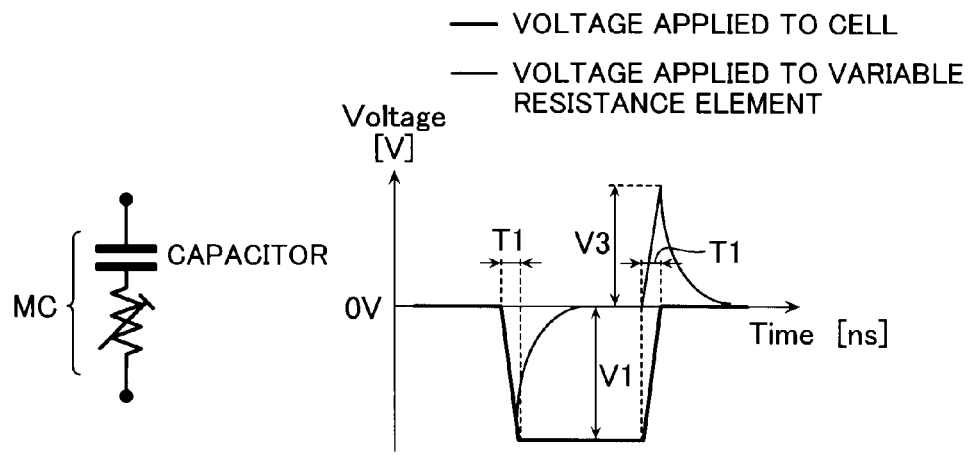
FIG. 10 is a diagram showing memory cells of the second embodiment and waveforms of voltages applied to the memory cells.
Figure 10:
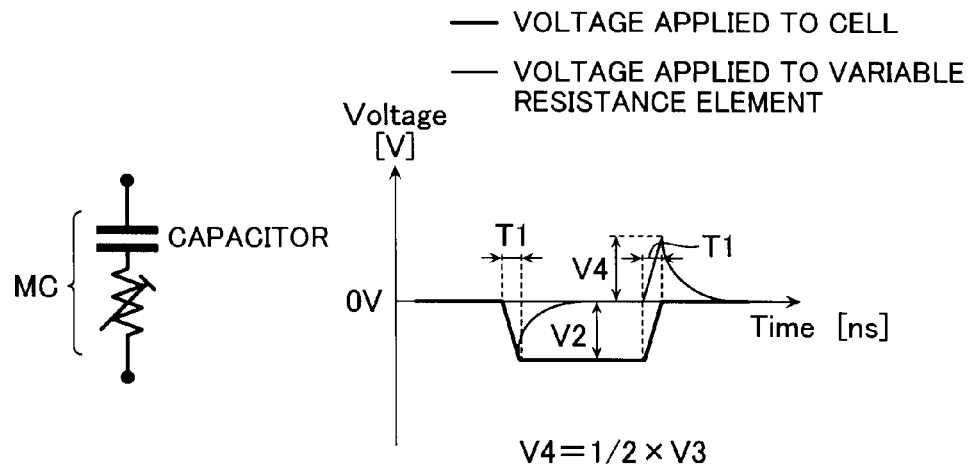

With reference to FIG. 9 and FIG. 10, a data erase operation of the nonvolatile semiconductor memory device according to the present embodiment will be explained. FIG. 9 is a diagram showing a memory cell array of the present embodiment and waveforms of erasing pulses generated by the control circuit in the data erase operation.

In the data erase operation of a selected cell, the column control circuit 2 applies a voltage pulse P1 to a selected bit line BL1. The voltage waveform of the voltage pulse P1 is shown in FIG. 9(2). The voltage pulse P1 shown in FIG. 9(2)

is a pulse having a negative voltage value, and has the same voltage V1 and the same time T1 necessary for the front and rear edges as those of the first embodiment. The column control circuit 2 applies a voltage pulse P2 to unselected bit lines BL0, BL2, and BL3. The voltage waveform of the voltage pulse P2 is shown in FIG. 9(3). As shown in FIG. 9(3), also the voltage pulse P2 is a pulse having a negative voltage value, and the absolute value (amplitude) of its voltage value is represented by a voltage V2. Here, it is assumed that the voltage V2 is ½ of the voltage V1. The time necessary for the front edge and the rear edges of the voltage pulse P2 is a time T1.

In the data erase operation of the selected cell, the row control circuit 3 sets a selected word line WL1 to 0V. Then, the row control circuit 3 applies a voltage pulse P2 to unselected word lines WL0, WL2, and WL3. The voltage waveform of the voltage pulse P2 applied to the unselected word lines WL0, WL2, and WL3 is the same as the voltage pulse P2 applied to the unselected bit lines BL0, BL2, and BL3, and shown in FIG. 9(3).

FIG. 10 is a diagram showing memory cells of the present embodiment and a waveform of voltages applied to the memory cells. FIG. 10 shows an equivalent circuit diagram of a selected cell and a voltage waveform, and an equivalent circuit diagram of half-selected cells and a voltage waveform. Here, as shown in FIG. 9(1), half-selected cells are a memory cell MC (half-selected cell 1) connected between the selected bit line BL1 and the unselected word line WL0, WL2, or WL3, and a memory cell MC (half-selected cell 2) connected between the unselected bit line BL0, BL2, or BL3 and the selected word line WL1.

As described above, the voltage pulse P1 applied to the selected bit line BL1 is a pulse having a negative voltage value. Therefore, the voltage pulse P1 applied across from the selected bit line BL1 to the selected word line WL1 is an erasing pulse in the reverse bias direction (here, a negative direction) with respect to the diode of the selected cell. FIG. 10(1) shows the waveform of a voltage applied to the variable resistance element VR when the voltage pulse P1 is applied to the selected cell. Like in the first embodiment, a charging current in the negative direction and a discharging current in a positive direction flow through the variable resistance element VR at the timings of the front edge and the rear edge of the voltage pulse P1, respectively. The variable resistance element VR of the selected cell changes from a low resistance state to a high resistance state due to these charging and discharging currents, and hence data is erased from the selected cell. It is preferred that the time T1 necessary for the front edge and the rear edge of the voltage pulse P1 be smaller than a product between the resistance value of the variable resistance element VR in a low resistance state and the junction capacitance of the diode to which a voltage is applied in the reverse bias direction.

On the other hand, in the half-selected cells 1, the voltage pulse P1 applied to the selected bit line BL1 is lower than the voltage pulse P2 applied to the unselected word lines WL0, WL2, and WL3. Therefore, a pulse in the reverse bias direction (here, a negative direction) with respect to the diode of the memory cells MC is applied to the half-selected cells 1. In the half-selected cells 2, the voltage pulse P2 applied to the unselected bit lines BL0, BL2, and BL3 is a pulse having a negative voltage value. Therefore, a pulse in the reverse bias direction (here, a negative direction) with respect to the diode of the memory cells MC is applied also to the half-selected cells 2. As described above, the diode of a memory cell MC to which a pulse is applied in the reverse bias direction comes to function as a capacitor. When the voltage pulse P1 and the voltage pulse P2 are applied to the half-selected cells, junction capacitance of the diode functioning as a capacitor is charged and discharged at the timings of the front edge and rear edge of the voltage pulse P1 and the voltage pulse P2. Hence, a current flows through the variable resistance element VR and a voltage is applied to the variable resistance element VR.

FIG. 10(2) shows the waveform of the voltage applied to the variable resistance element VR when the voltage pulse P1 and the voltage pulse P2 are applied to the half-selected cells. Since the voltage value of the voltage pulse P2 is ½ of the voltage V1, the absolute values (amplitudes) of the voltage values of the pulses applied to the half-selected cells 1 and the half-selected cells 2 are both the voltage V2. A charging current in the negative direction and a discharging current in the positive direction flow through the variable resistance element VR at the timings of the front edge and the rear edge of the voltage pulse P1 and the voltage pulse P2. The absolute value of the voltage value applied to the variable resistance element VR is represented by a voltage V4. Since the value of the voltage V2 is ½ of the value of the voltage V1, the value of the voltage V4 is ½ of the value of a voltage V3. The voltage V4 is sufficiently lower than the voltage V1, and hence the variable resistance element VR of the half-selected cells does not change from a low resistance state to a high resistance state.

[Effect of Nonvolatile Semiconductor Memory Device According to Second Embodiment]

The nonvolatile semiconductor memory device according to the present embodiment also applies an erasing pulse in the reverse bias direction with respect to the diode of the selected cell. Hence, the diode of the selected cell functions as a capacitor. Also in the present embodiment, the instant the variable resistance element VR of the selected cell shifts from a low resistance state to a high resistance state, the voltage applied to the variable resistance element VR does not rise, thus preventing an erroneous writing. Thus, the nonvolatile semiconductor memory device according to the present embodiment can suppress the risk of erroneous writing in the data erase operation.

The nonvolatile semiconductor memory device according to the present embodiment applies a voltage pulse in the reverse bias direction of the diode of the half-selected cells. Even when a voltage pulse is applied in the manner described above, the variable resistance element VR of the half-selected cells does not change from a low resistance state to a high resistance state as described above. In the unselected cells connected between the unselected bit line BL0, BL2, or BL3 and the unselected word line WL0, WL2, or WL3, there is no potential difference between the bit line BL and the word line WL. Therefore, no current flows through these memory cells MC and no fault occurs in the data erase operation.

In the first embodiment, a voltage is applied to the unselected cells in the forward bias direction of the diode. Therefore, there is a fear that a current flows through the unselected cells to increase the electricity consumption in the data erase operation. Since most of the memory cells MC in the memory cell array are unselected cells, increase of the electricity consumption is particularly feared. However, according to the present embodiment, all of the selected cell, the half-selected cells, and the unselected cells either have a voltage applied thereto in the reverse bias direction with respect to the diode or have no potential difference. Therefore, the electricity consumption is not to be increased in the data erase operation.

THIRD EMBODIMENT

[Configuration of Nonvolatile Semiconductor Memory Device According to Third Embodiment]

Next, a nonvolatile semiconductor memory device according to a third embodiment of the present invention will be explained. Since the configuration of the nonvolatile semiconductor memory device according to the third embodiment is similar to the first embodiment, redundant explanation will not be given. The nonvolatile semiconductor memory device according to the third embodiment is different from the first embodiment in the time necessary for the front edge of a voltage pulse to be applied to the bit lines BL and the word lines WL in the data erase operation.

[Operation of Nonvolatile Semiconductor Memory Device According to Third Embodiment]

Figure 11:
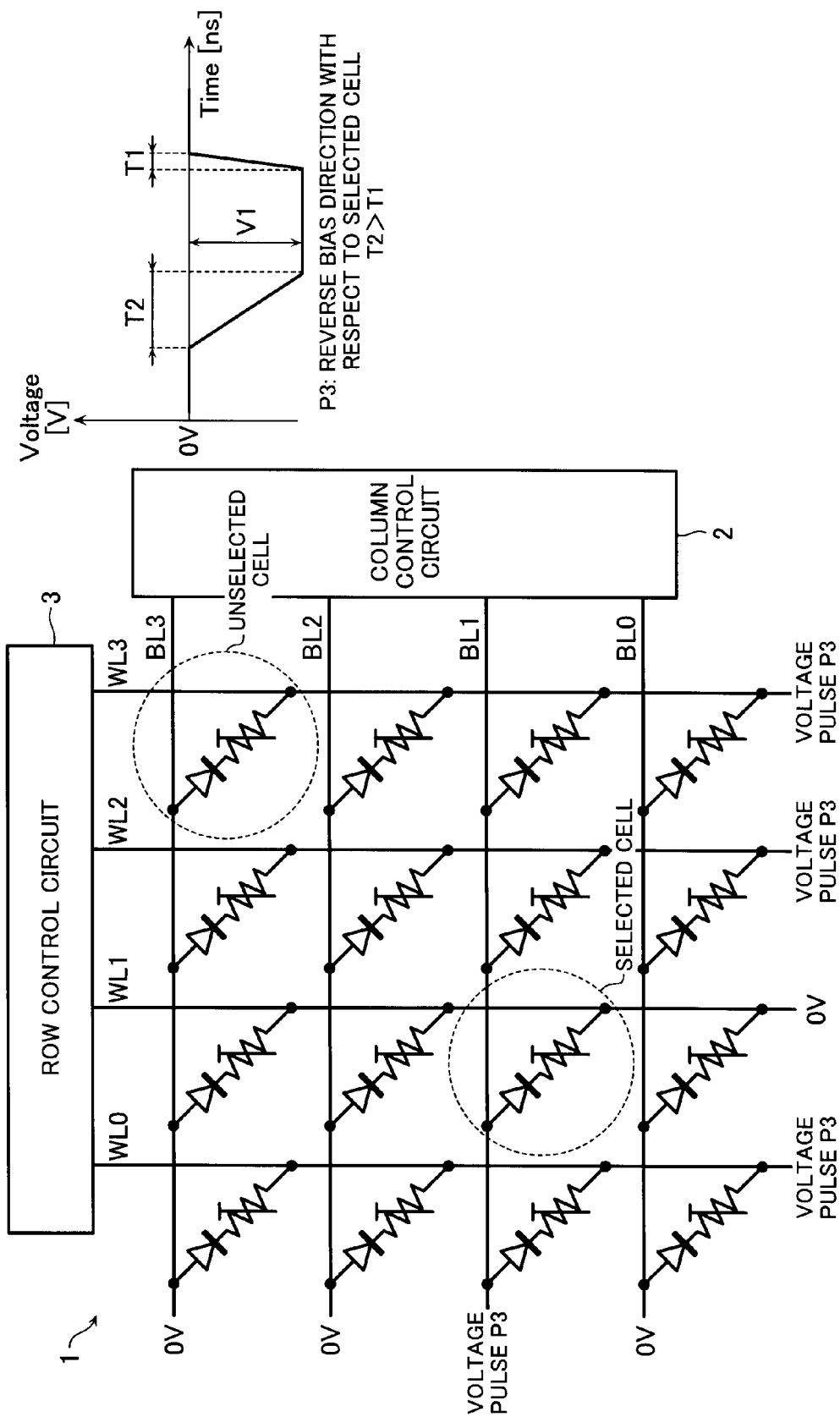
FIG. 11 is a diagram showing a memory cell array of a third embodiment and a waveform of an erasing pulse generated by a control circuit in a data erase operation.
Figure 12:
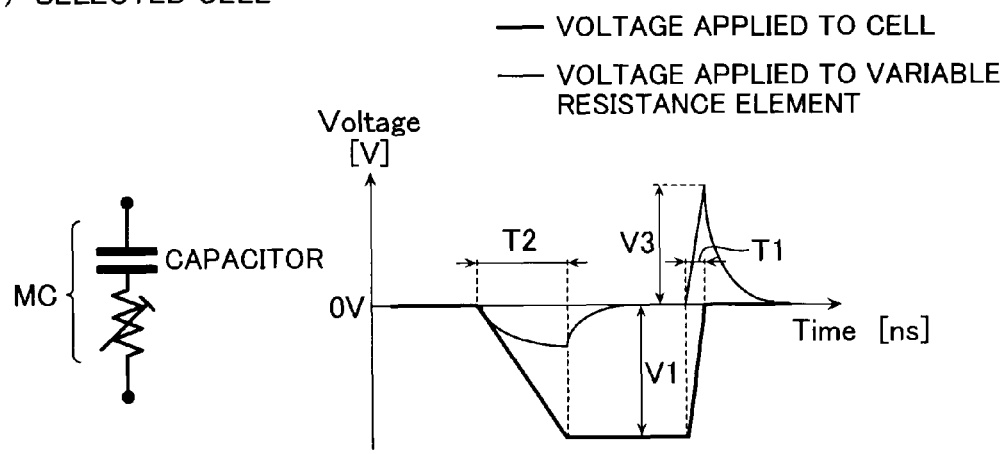
FIG. 12 is a diagram showing memory cells of the third embodiment and waveforms of voltages applied to the memory cells.
Figure 12:
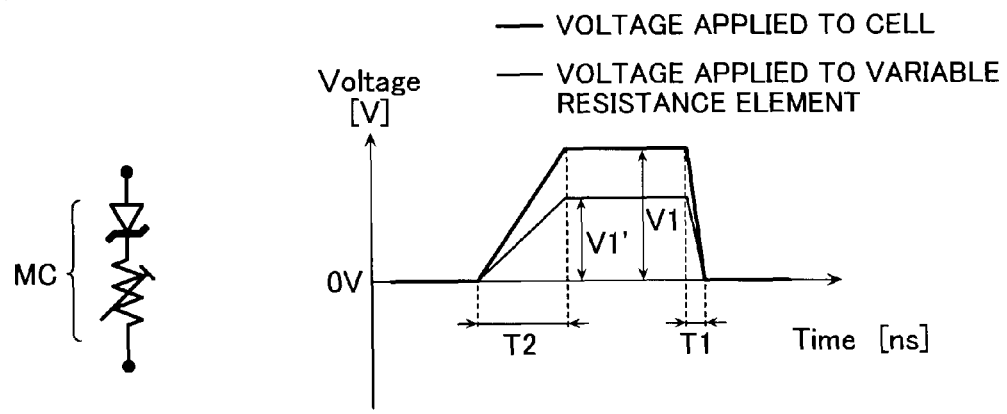

With reference to FIG. 11 and FIG. 12, the data erase operation of the nonvolatile semiconductor memory device according to the present embodiment will be explained. FIG. 11 is a diagram showing a memory cell array of the present embodiment and the waveform of an erasing pulse generated by the control circuit in the data erase operation.

In the data erase operation of the selected cell, the column control circuit 2 applies a voltage pulse P3 to the selected bit line BL1. The waveform of the voltage pulse P3 is shown in FIG. 11(2). As shown in FIG. 11(2), the voltage pulse P3 is a pulse having a negative voltage value, and the absolute value (amplitude) of this voltage value is represented by a voltage V1. The time necessary for the front edge of the voltage pulse P3 is a time T2, and the time necessary for the rear edge thereof is a time T1. The time T2 is longer than the time T1, and hence the voltage change of the voltage pulse P3 at the timing of the front edge of the voltage pulse P3 is more moderate than the voltage change at the timing of the rear edge. The column control circuit 2 sets the unselected bit lines BL0, BL2, and BL3 to 0V.

In the data erase operation of the selected cell, the row control circuit 3 sets the selected word line WL1 to 0V. Then, the row control circuit 3 applies a voltage pulse P3 to the unselected word lines WL0, WL2, and WL3. The voltage waveform of the voltage pulse P3 applied to the unselected word lines WL0, WL2, and WL3 is the same as the voltage pulse P3 applied to the selected bit line BL1, and shown in FIG. 11(2).

FIG. 12 is a diagram showing the memory cells of the present embodiment and the waveform of the voltages applied to the memory cells. FIG. 12 shows an equivalent circuit diagram of the selected cell and a voltage waveform, and an equivalent circuit diagram of the unselected cells and a voltage waveform. Here, the unselected cells are the memory cells MC connected between the unselected bit line BL0, BL2, or BL3 and the unselected word line WL0, WL2, or WL3 like in the first embodiment.

As described above, the voltage pulse P3 applied to the selected bit line BL1 is a pulse having a negative voltage value. Therefore, the voltage pulse P3 applied across from the selected bit line BL1 to the selected word line WL1 is an erasing pulse in the reverse bias direction (here, a negative direction) with respect to the diode of the selected cell. As shown in FIG. 12(1), the diode of the selected cell to which a pulse is applied in the reverse bias direction functions as a capacitor. When the voltage pulse P3 is applied to the memory cell MC, the junction capacitance of the diode functioning as a capacitor is discharged at the timing of the rear edge of the voltage pulse P3. Hence, a current flows through the variable resistance element VR, and a voltage is applied to the variable resistance element VR. FIG. 12(1) shows the waveform of the voltage applied to the variable resistance element VR when the voltage pulse P3 is applied to the selected cell. A charging current in a positive direction flows through the variable resistance element VR at the timing of the rear edge of the voltage pulse P3. The variable resistance element VR of the selected cell changes from a low resistance state to a high resistance state, and data is erased from the selected cell.

Since the voltage change of the voltage pulse P3 at the timing of the front edge of the voltage pulse P3 is more moderate than the voltage change at the timing of the rear edge, a voltage in the negative direction which is applied to the variable resistance element VR at the timing of the front edge of the voltage pulse P3 is lower than a voltage V3. The resistance state of the variable resistance element VR of the selected cell does not change at the timing of the front edge of the voltage pulse P3. Here, it is preferred that the time T1 necessary for the rear edge of the voltage pulse P3 be smaller than a product between the resistance value of the variable resistance element VR in a low resistance state and the junction capacitance of the diode to which a voltage is applied to the reverse bias direction.

On the other hand, in the unselected cells, the voltage pulse P3 applied to the unselected word lines WL0, WL2, and WL3 is a pulse in the forward bias direction (here, a positive direction) with respect to the diode of the unselected cells. As shown in FIG. 12(2), the diode of the unselected cells to which a pulse is applied in the forward bias direction does not function as a capacitor. FIG. 12(2) shows the waveform of a voltage applied to the variable resistance element VR when the voltage pulse P3 in the forward bias direction is applied to the unselected cells. Like in the first embodiment, the voltage V1' applied to the variable resistance element VR can be represented as $V1'=V1 \times R_{on}/(R_{diode}+R_{on})$. The voltage V1' is sufficiently lower than the voltage V1, and hence the variable resistance element VR of the unselected cells does not change from a low resistance state to a high resistance state.

[Effect of Nonvolatile Semiconductor Memory Device According to Third Embodiment]

Also the nonvolatile semiconductor memory device according to the present embodiment applies an erasing pulse in the reverse bias direction with respect to the diode of the selected cell. Therefore, the diode of the selected cell functions a capacitor. Also in the present embodiment, the instant the variable resistance element VR of the selected cell shifts from a low resistance state to a high resistance state, the voltage applied to the variable resistance element VR does not rise, thus preventing an erroneous writing. Thus, the nonvolatile semiconductor memory device according to the present embodiment can suppress the risk of erroneous writing in the data erase operation.

If the variable resistance element VR is applied with the voltage V3 at the timing of the front edge of the voltage pulse P1 as in the first embodiment, a current flows through the variable resistance element VR at the timing of the front edge of the voltage pulse P1, which might deteriorate the variable resistance element VR. As compared with this, in the nonvolatile semiconductor memory device according to the present embodiment, the time T2 necessary for the front edge of the voltage pulse P3 is long and the voltage change of the voltage pulse P3 at the timing of the front edge is moderate. Therefore, no excessive current flows through the variable resistance element VR of the selected cell at the timing of the front edge of the voltage pulse P3, and deterioration of the variable resistance element VR can be reduced.

Further, even when an erasing pulse is applied in the manner described above, the variable resistance element VR of the unselected cells does not change from a low resistance state to a high resistance state as described above. In the half-selected cells connected between the unselected bit line BL0, BL2, or BL3 and the selected word line WL1 and between the selected bit line BL1 and the unselected word line WL0, WL2, or WL3, there is no potential difference between the bit line BL and the word line WL. Therefore, no current flows through these half-selected cells and no fault occurs in the data erase operation.

FOURTH EMBODIMENT

[Configuration of Nonvolatile Semiconductor Memory Device According to Fourth Embodiment]
Next, a nonvolatile semiconductor memory device according to a fourth embodiment of the present invention will be explained. Since the configuration of the nonvolatile semiconductor memory device according to the fourth embodiment is similar to the first embodiment, redundant explanation will not be given. The nonvolatile semiconductor memory device according to the fourth embodiment executes the data erase operations according to the second embodiment and the third embodiment in combination.

Figure 13:
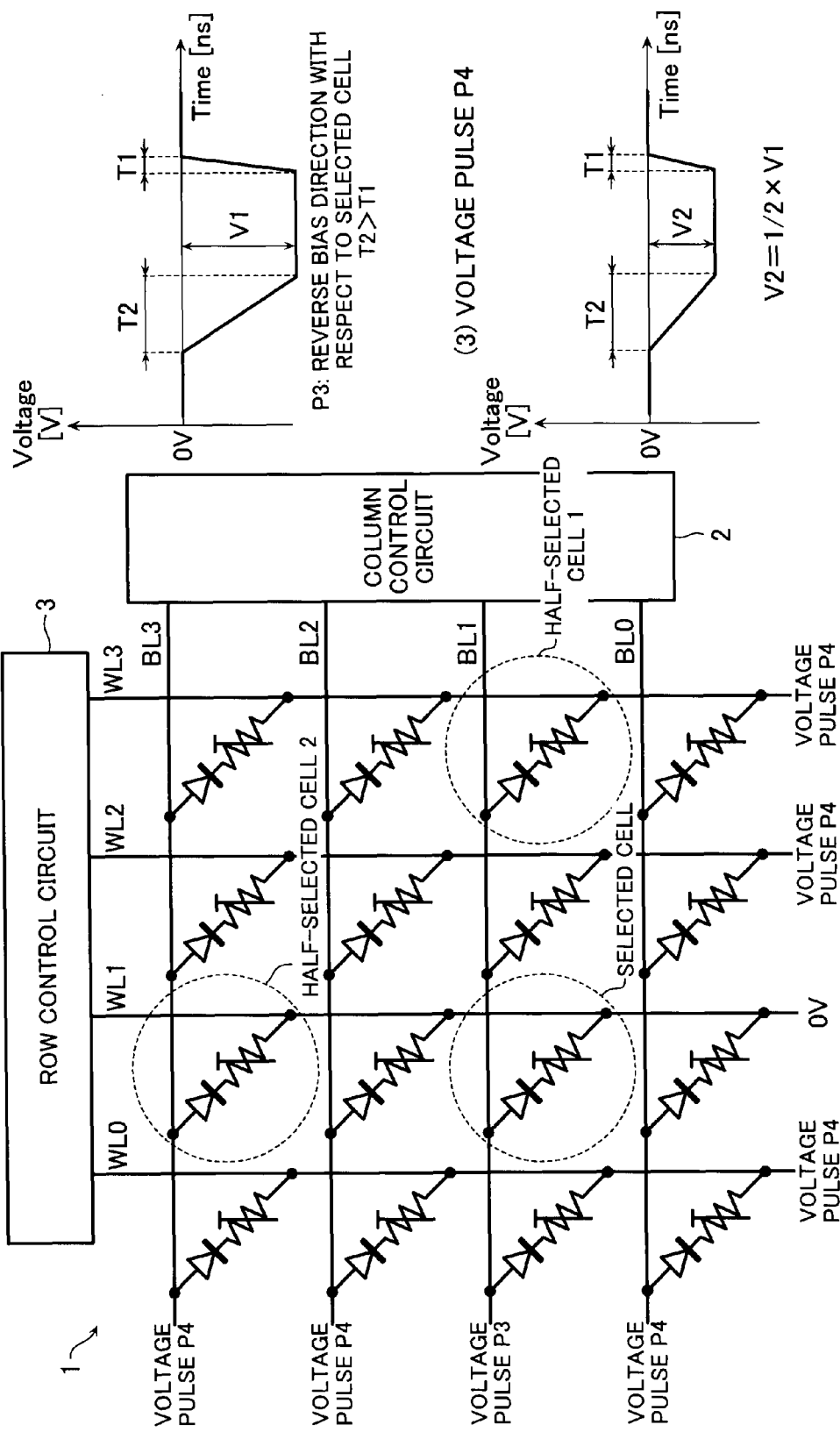
FIG. 13 is a diagram showing a memory cell array of a fourth embodiment and waveforms of erasing pulses generated by a control circuit in a data erase operation.

[Operation of Nonvolatile Semiconductor Memory Device According to Fourth Embodiment]
With reference to FIG. 13 and FIG. 14, the data erase operation of the nonvolatile semiconductor memory device according to the present embodiment will be explained. FIG. 13 is a diagram showing a memory cell array of the present embodiment and the waveform of an erasing pulse generated by the control circuit in the data erase operation.

In the data erase operation of the selected cell, the column control circuit 2 applies a voltage pulse P3 to the selected bit line BL1. The voltage waveform of the voltage pulse P3 is shown in FIG. 13(2). The voltage pulse P3 shown in FIG. 13(2) is a pulse having a negative voltage value, and has the same voltage V1, the same time T2 necessary for the front edge, and the same time T1 necessary for the rear edges as those of the third embodiment. The column control circuit 2 applies a voltage pulse P4 to the unselected bit lines BL0, BL2, and BL3. The voltage waveform of the voltage pulse P4 is shown in FIG. 13(3). As shown in FIG. 13(3), also the voltage pulse P4 is a pulse having a negative voltage value, and the absolute value (amplitude) of this voltage value is represented by a voltage V2. Here, it is assumed that the value of the voltage V2 is ½ of the voltage V1. The time necessary for the front edge of the voltage pulse P4 is the time T2, and the time necessary for the rear edge thereof is the time T1.

In the data erase operation of the selected cell, the row control circuit 3 sets the selected word lien WL1 to 0V. Then, the row control circuit 3 applies a voltage pulse P4 to the unselected word lines WL0, WL2, and WL3. The voltage waveform of the voltage pulse P4 applied to the unselected word lines WL0, WL2, and WL3 is the same as the voltage pulse P4 applied to the unselected bit lines BL0, BL2, and BL3, and shown in FIG. 13(3).

Figure 14:
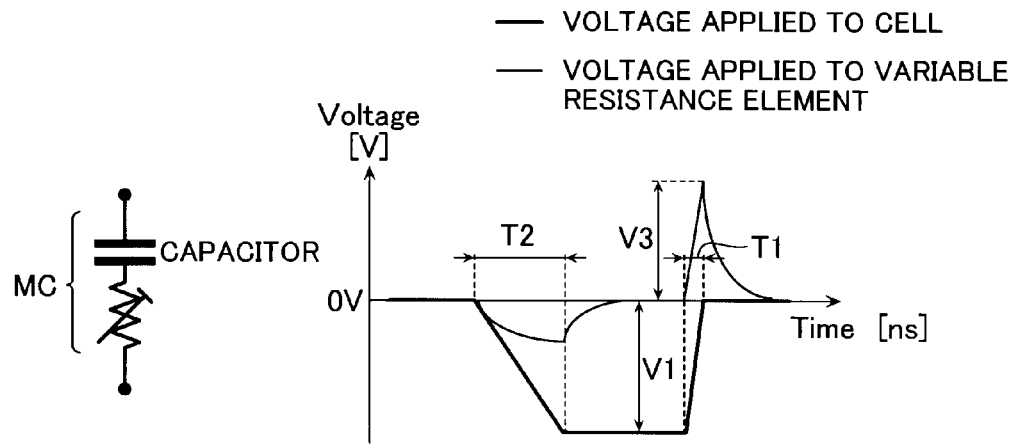
FIG. 14 is a diagram showing memory cells of the fourth embodiment and waveforms of voltages applied to the memory cells.
Figure 14:
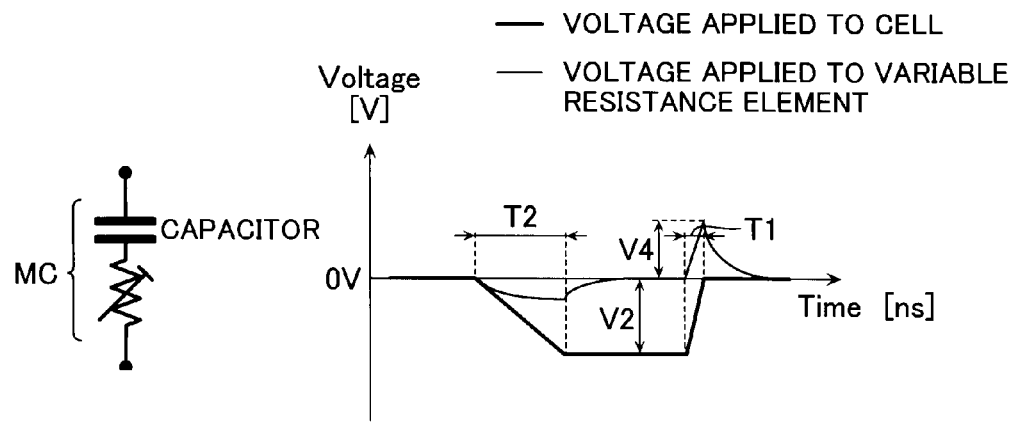

FIG. 14 is a diagram showing the memory cells of the present embodiment and the waveforms of voltages applied to the memory cells. FIG. 14 shows an equivalent circuit diagram of the selected cell and a voltage waveform, and an equivalent circuit diagram of half-selected cells and a voltage waveform. Here, half-selected cells are the memory cells MC connected between the selected bit line BL1 and the unselected word line WL0, WL2, or WL3 (half-selected cells 1), and the memory cells MC connected between the unselected bit line BL0, BL2, or BL3 and the selected word line W11 (half-selected cells 2) like in the second embodiment.

As described above, the voltage pulse P3 applied to the selected bit line BL1 is a pulse having a negative voltage value. Therefore, the voltage pulse P3 applied across from the selected bit line BL1 to the selected word line WL1 is an erasing pulse in the reverse bias direction (here, a negative direction) with respect to the diode of the selected cell. As shown in FIG. 14(1), the diode of the selected cell to which a pulse is applied in the reverse bias direction functions as a capacitor. When the voltage pulse P3 is applied to this memory cell MC, the junction capacitance of the diode functioning as a capacitor is discharged at the timing of the rear edge of the voltage pulse P3. Hence, a current flows through the variable resistance element VR, and a voltage is applied to the variable resistance element VR. FIG. 14(1) shows the waveform of the voltage applied to the variable resistance element VR when the voltage pulse P3 is applied to the selected cell. Like in the third embodiment, a discharging current in the positive direction flows through the variable resistance element VR at the timing of the rear edge of the voltage pulse P3. The variable resistance element VR of the selected cell changes from a low resistance state to a high resistance state due to this discharging current, and data is erased from the selected cell.

Since the voltage change of the voltage pulse P3 at the timing of the front edge is more moderate than the voltage change at the timing of the rear edge, a voltage in the negative direction which is applied to the variable resistance element VR at the timing of the front edge of the voltage pulse P3 is lower than the voltage V3. The resistance state of the variable resistance element VR of the selected cell does not change at the timing of the front edge of the voltage pulse P3. Here, it is preferred that the time T1 necessary for the rear edge of the voltage pulse P3 be smaller than the product between the resistance value of the variable resistance element VR in a low resistance state and the junction capacitance of the diode to which a voltage is applied in the reverse bias direction.

On the other hand, in the half-selected cells 1, the voltage pulse P3 applied to the selected bit line BL1 is lower than the voltage pulse P4 applied to the unselected word lines WL0, WL2, and WL3. Therefore, a pulse in the reverse bias direction (here, a negative direction) with respect to the diode of the memory cells MC is applied to the half-selected cells 1. In the half-selected cells 2, the voltage pulse P4 applied to the unselected bit lines BL0, BL2, and BL3 is a pulse having a negative voltage value. Therefore, a pulse in the reverse bias direction (here, a negative direction) with respect to the diode of the memory cells MC is applied also to the half-selected cells 2. When the voltage pulse P3 and the voltage pulse P4 are applied to the half-selected cells, the junction capacitance of the diode functioning as a capacitor is discharged at the timing of the rear edge of the voltage pulse P3 and the voltage pulse P4. Hence, a current flows through the variable resistance element VR, and a voltage is applied to the variable resistance element VR.

FIG. 14(2) shows the waveform of the voltage applied to the variable resistance element VR when the voltage pulse P3 and the voltage pulse P4 are applied to the half-selected cells. Since the voltage value of the voltage pulse P4 is ½ of the voltage V1, the absolute values (amplitudes) of the voltage values of the pulses applied to the half-selected cells 1 and the half-selected cells 2 are both the voltage V2. A voltage in the positive direction is applied to the variable resistance element VR at the timing of the rear edge of the voltage pulse P3 and the voltage pulse P4. Here, the absolute value of the voltage value applied to the variable resistance element VR is represented by a voltage V4. Since the value of the voltage V2 is ½ of the value of the voltage V1, the value of the voltage V4 is ½ of the voltage V3. The voltage V4 is sufficiently lower than the voltage V1, and hence the variable resistance element VR of the half-selected cells does not change from a low resistance state to a high resistance state.

Since the voltage change of the voltage pulse P3 and the voltage pulse P4 at the timing of the front edge is more moderate than the voltage change at the timing of the rear edge, the voltage in the negative direction which is applied to the variable resistance element VR at the timing of the front edge of the voltage pulse P3 and the voltage pulse P4 is lower than the voltage V4. The resistance state of the variable resistance element VR of the half-selected cells does not change also at the timing of the front edge of the voltage pulse P3 and the voltage pulse P4.

[Effect of Nonvolatile Semiconductor Memory Device According to Fourth Embodiment]

Also the nonvolatile semiconductor memory device according to the present embodiment applies an erasing pulse in the reverse bias direction with respect to the diode of the selected cell. Hence, the diode of the selected cell functions as a capacitor. Also in the present embodiment, the instant the variable resistance element VR of the selected cell shifts from a low resistance state to a high resistance state, the voltage applied to the variable resistance element VR does not rise, thus preventing an erroneous writing. Thus, the nonvolatile semiconductor memory device according to the present embodiment can suppress the risk of erroneous writing in the data erase operation.

The nonvolatile semiconductor memory device according to the present embodiment applies a voltage pulse in the reverse bias direction with respect to the diode of the half-selected cells. Even when a voltage pulse is applied in this manner, the variable resistance element VR of the half-selected cells does not change from a low resistance state to a high resistance state as described above. In the unselected cells connected between the unselected bit line BL0, BL2, or BL3 and the unselected word line WL0, WL2, or WL3, there is no potential difference between the bit line BL and the word line WL. Therefore, no current flows through these memory cells MC and no fault occurs in the data erase operation.

In the present embodiment, all of the selected cell, the half-selected cells, and the unselected cells either have a voltage applied thereto in the reverse bias direction with respect to the diode or have no potential difference. Therefore, the electricity consumption is not to be increased in the data erase operation. Further, according to the nonvolatile semiconductor memory device according to the present embodiment, the time T2 necessary for the front edge of the voltage pulse P3 is long and hence the voltage change of the voltage pulse P3 at the timing of the front edge is moderate. No excessive current flows through the variable resistance element VR of the selected cell at the timing of the front edge of the voltage pulse P3, and deterioration of the variable resistance element VR can be reduced.

OTHERS

Figure 15:
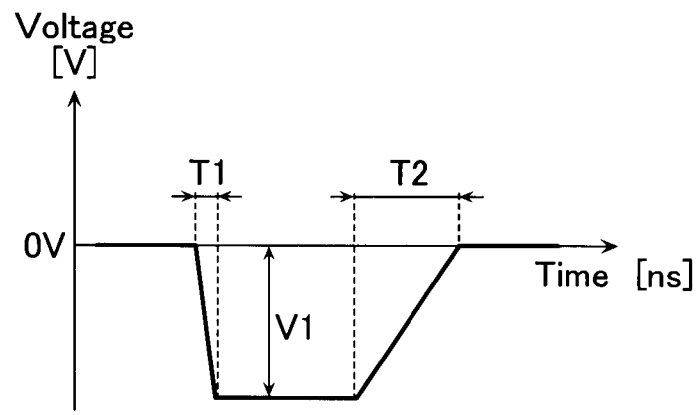
FIG. 15 is a diagram showing a waveform of an erasing pulse generated by a control circuit in a data erase operation according to another example.
Figure 16:
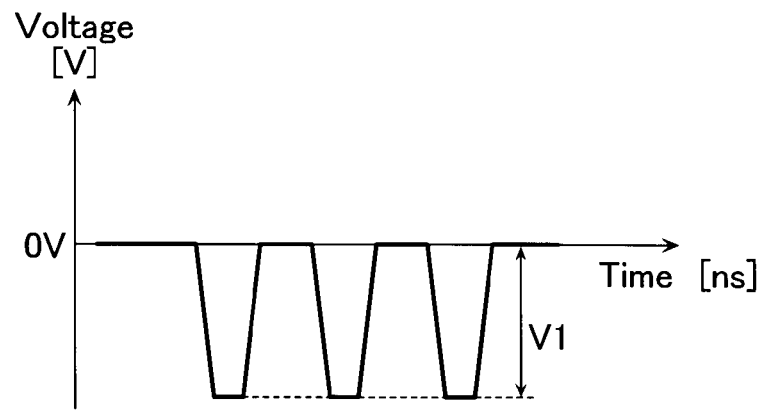
FIG. 16 is a diagram showing a waveform of an erasing pulse generated by a control circuit in a data erase operation according to yet another example.

Though the embodiments of the present invention have been described, the present invention is not limited to these embodiments, but various changes, additions, combinations, etc. are available within the scope of the spirit of the invention. For example, in the data erase operation, it does not matter which of the time necessary for the front edge of the voltage pulse and the time necessary for the rear edge thereof is shorter. As shown in FIG. 15, data erase may be executed by using a voltage pulse in which the time necessary for the front edge is the time T1 and the time necessary for the rear edge is the time T2. In this case, the junction capacitance of the diode functioning as a capacitor is charged at the timing of the front edge of the voltage pulse. Hence, a current flows through the variable resistance element VR and a voltage is applied to the variable resistance element VR. Further, since the nonvolatile semiconductor memory device according to the embodiments utilizes charging and discharging of the capacitor at the timings of the front edge and the rear edge of the erasing pulse, it may apply the voltage pulse plural times consecutively as shown in FIG. 16.

In the embodiments, it has been explained that the data erase operation of the memory cells MC is executed by applying a voltage in the reverse bias direction with respect to the diode. In contrast, a write operation of the memory cells MC can be executed by using a method of applying a certain voltage in the forward bias direction with respect to the diode. In this case, data can be written into the selected cell by applying a certain voltage to the selected cell by applying a writing pulse having a positive voltage value to the selected bit line BL1 and setting the selected word line to, for example, 0V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a memory cell array including a plurality of first wirings, a plurality of second wirings intersecting the plurality of first wirings, and a plurality of memory cells provided at intersections of the plurality of first and second wirings and each including a non-ohmic element and a variable resistance element connected in series; and
a control circuit configured to select one of the plurality of memory cells, generate an erasing pulse for erasing data from the selected memory cell, and supply the erasing pulse to the selected memory cell,
the control circuit being configured to execute data erase by applying a voltage of the erasing pulse to the non-ohmic element in a reverse bias direction.

2. The nonvolatile semiconductor memory device according to claim 1,
wherein the first wirings are coupled with anodes of the non-ohmic elements,
the second wirings are coupled with cathodes of the non-ohmic elements, and
the control circuit applies a first voltage pulse having a negative voltage value to a selected one of the first wirings.

3. The nonvolatile semiconductor memory device according to claim 2,
wherein the control circuit applies a second voltage pulse having a negative voltage value and having a voltage amplitude smaller than that of the first voltage pulse to unselected ones of the first wirings and unselected ones of the second wirings.

4. The nonvolatile semiconductor memory device according to claim 3,
wherein the voltage amplitude of the second voltage pulse is substantially a half of the voltage amplitude of the first voltage pulse.

5. The nonvolatile semiconductor memory device according to claim 3,
wherein a time necessary for a front edge of the first voltage pulse and the second voltage pulse is different from a time necessary for a rear edge thereof, and the time necessary for the front edge of the first voltage pulse is substantially the same as the time necessary for the front edge of the second voltage pulse, and the time necessary for the rear edge of the first voltage pulse is substantially the same as the time necessary for the rear edge of the second voltage pulse.

6. The nonvolatile semiconductor memory device according to claim 2,
wherein a time necessary for a front edge of the first voltage pulse is different from a time necessary for a rear edge thereof.

7. The nonvolatile semiconductor memory device according to claim 2,
wherein a time necessary for a front edge of the first voltage pulse or a time necessary for a rear edge thereof is smaller than a product between a resistance value of the variable resistance element in a low resistance state and a value of junction capacitance of the non-ohmic element.

8. The nonvolatile semiconductor memory device according to claim 2,
wherein the control circuit applies the first voltage pulse plural times.

9. A nonvolatile semiconductor memory device, comprising:
a memory cell array including a plurality of first wirings, a plurality of second wirings intersecting the plurality of first wirings, and a plurality of memory cells provided at intersections of the plurality of first and second wirings and each including a diode element and a variable resistance element connected in series, the diode element functioning as a capacitor when a voltage is applied in a reverse bias direction; and
a control circuit configured to select one of the plurality of memory cells, generate an erasing pulse for erasing data from the selected memory cell, and supply the erasing pulse to the selected memory cell,
the control circuit being configured to execute data erase by applying a voltage of the erasing pulse to the diode element in the reverse bias direction.

10. The nonvolatile semiconductor memory device according to claim 9,
wherein the first wirings are coupled with anodes of the diode elements,
the second wirings are coupled with cathodes of the diode elements, and
the control circuit applies a first voltage pulse having a negative voltage value to a selected one of the first wirings.

11. The nonvolatile semiconductor memory device according to claim 10,
wherein the control circuit applies a second voltage pulse having a negative voltage value and having a voltage amplitude smaller than that of the first voltage pulse to unselected ones of the first wirings and unselected ones of the second wirings.

12. The nonvolatile semiconductor memory device according to claim 11,
wherein the voltage amplitude of the second voltage pulse is substantially a half of the voltage amplitude of the first voltage pulse.

13. The nonvolatile semiconductor memory device according to claim 11,
wherein a time necessary for a front edge of the first voltage pulse and the second voltage pulse is different from a time necessary for a rear edge thereof, and
the time necessary for the front edge of the first voltage pulse is substantially the same as the time necessary for the front edge of the second voltage pulse, and the time necessary for the rear edge of the first voltage pulse is substantially the same as the time necessary for the rear edge of the second voltage pulse.

14. The nonvolatile semiconductor memory device according to claim 10,
wherein a time necessary for a front edge of the first voltage pulse is different from a time necessary for a rear edge thereof.

15. The nonvolatile semiconductor memory device according to claim 10,
wherein a time necessary for a front edge of the first voltage pulse or a time necessary for a rear edge thereof is smaller than a product between a resistance value of the variable resistance element in a low resistance state and a value of junction capacitance of the diode element.

16. The nonvolatile semiconductor memory device according to claim 10,
wherein the control circuit applies the first voltage pulse plural times.

17. A nonvolatile semiconductor memory device, comprising:
a memory cell array including a plurality of first wirings, a plurality of second wirings intersecting the plurality of first wirings, and a plurality of memory cells provided at intersections of the plurality of first and second wirings and each including a non-ohmic element and a variable resistance element connected in series; and
a control circuit configured to select one of the plurality of memory cells, generate an erasing pulse for erasing data from the selected memory cell, and supply the erasing pulse to the selected memory cell,
the first wirings being coupled with anodes of the non-ohmic elements,
the second wirings being coupled with cathodes of the non-ohmic elements,
the control circuit being configured to execute data erase of the memory cell by applying the erasing pulse to the non-ohmic element in a reverse bias direction by applying a first voltage pulse having a negative voltage value to a selected one of the first wirings and unselected ones of the second wirings and applying a fixed voltage having a certain voltage value to a selected one of the second wirings and unselected ones of the first wirings.

18. The nonvolatile semiconductor memory device according to claim 17,
wherein a time necessary for a front edge of the first voltage pulse is different from a time necessary for a rear edge thereof.

19. The nonvolatile semiconductor memory device according to claim 17,
wherein a time necessary for a front edge of the first voltage pulse or a time necessary for a rear edge thereof is smaller than a product between a resistance value of the variable resistance element in a low resistance state and a value of junction capacitance of the non-ohmic element.

20. The nonvolatile semiconductor memory device according to claim 17,
wherein the control circuit applies the first voltage pulse plural times.

* * * * *